United States Patent
Hanrahan et al.

(10) Patent No.: US 6,288,566 B1
(45) Date of Patent: Sep. 11, 2001

(54) CONFIGURATION STATE MEMORY FOR FUNCTIONAL BLOCKS ON A RECONFIGURABLE CHIP

(75) Inventors: Shaila Hanrahan; Christopher E. Phillips, both of San Jose, CA (US)

(73) Assignee: Chameleon Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/401,312

(22) Filed: Sep. 23, 1999

(51) Int. Cl.[7] ................................................. H03K 19/173
(52) U.S. Cl. ................................................. 326/38; 326/40
(58) Field of Search ................................. 326/40, 38–39, 326/47, 46, 41

(56) References Cited

U.S. PATENT DOCUMENTS

| | | | |
|---|---|---|---|
| 5,426,378 | * | 6/1995 | Ong ........................................ 326/39 |
| 5,550,782 | * | 8/1996 | Cliff et al. ...................... 365/230.03 |
| 5,760,602 | * | 6/1998 | Tan ........................................ 326/38 |
| 5,796,269 | * | 8/1998 | New ...................................... 326/40 |
| 6,005,865 | * | 12/1999 | Lewis et al. ......................... 370/398 |
| 6,018,559 | * | 1/2000 | Azegami et al. ...................... 377/79 |
| 6,091,263 | * | 7/2000 | New et al. ............................ 326/40 |

* cited by examiner

Primary Examiner—Michael Tokar
Assistant Examiner—James H. Cho
(74) Attorney, Agent, or Firm—Burns Doane Swecker & Mathis

(57) ABSTRACT

A configuration state memory is associated with a configurable functional block on a reconfigurable chip. The configuration state memory stores more than one configuration for the functional block. This allows the functional block to switch configurations without requiring the configuration data to be loaded from off-chip which would stall the operation of the reconfigurable chip. In a preferred embodiment, the configuration state memory uses a relatively few address bits to produce a relatively broad configuration output to the functional blocks. The small number of input address bits allows the configuration state memory to be addressed by relatively small state machine unit.

37 Claims, 6 Drawing Sheets

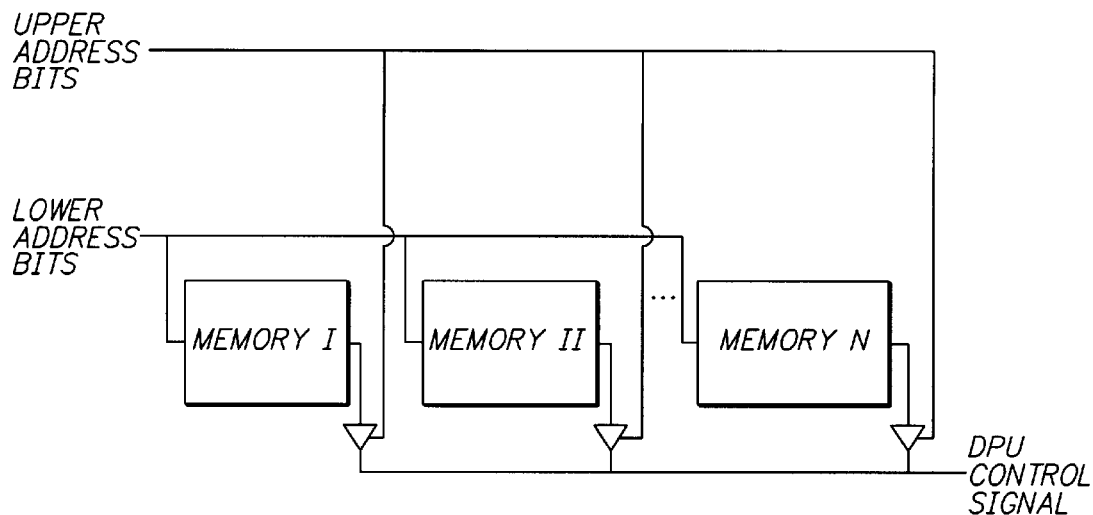
FIG. 2B
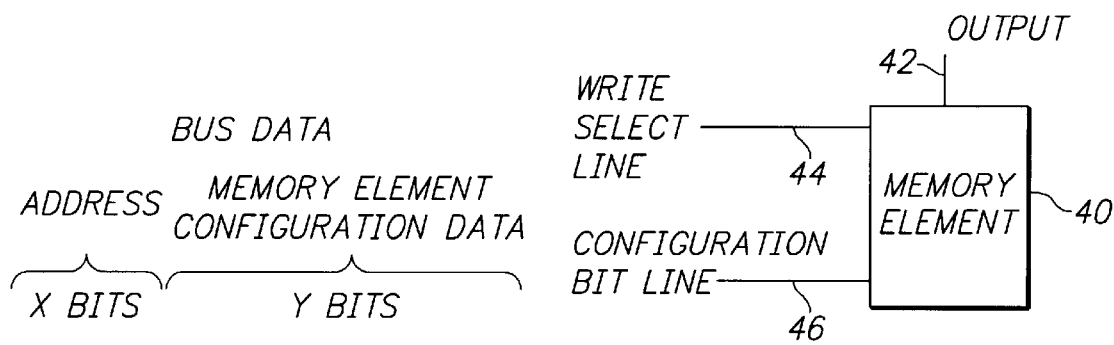
FIG. 3
FIG. 5
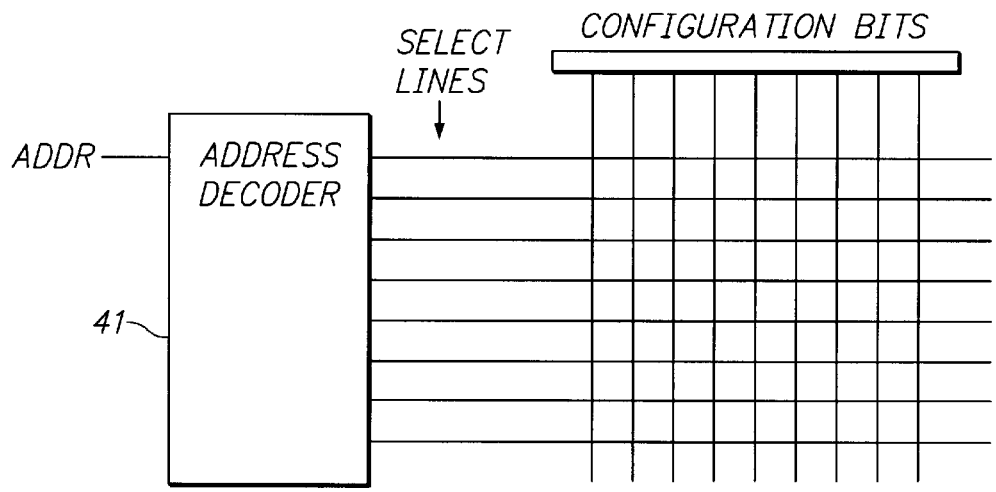
FIG. 4

CONFIGURATION STATE MEMORY FOR FUNCTIONAL BLOCKS ON A RECONFIGURABLE CHIP

BACKGROUND OF THE INVENTION

The present invention relates to reconfigurable logic chips.

Reconfigurable logic chips, such as field programmable gate arrays (FPGAs) have become increasingly popular. Such chips allow logic to implement different circuits at different times.

FPGAs are being increasingly used because they offer greater flexibility and shorter development cycles than traditional Application Specific Integrated Circuits (ASICs) while providing most of the performance advantages of a dedicated hardware solution.

One growingly popular use of FPGAs is referred to as reconfigurable computing. In reconfigurable computing, hardware logic functions are loaded into the FPGA as needed to implement different sections of a computationally intensive code. By using the FPGAs to do the computational intensive code, advantages are obtained over dedicated processors. Reconfigurable computing is being pursued by university researchers as well as FPGA companies.

Typically, in order to change configurations, FPGAs load new configuration data for different functional units from off-chip. This can be time consuming and may reduce the efficiency of a reconfigurable computing system. It is desired to have an improved reconfigurable chip for reconfigurable computing.

SUMMARY OF THE PRESENT INVENTION

The present invention comprises a configuration state memory for use on a reconfigurable chip. The configuration state memory stores multiple configurations which can be used to configure a functional block unit into a variety of functions. By storing multiple configurations local to the functional block unit in the configuration statement memory, the system of the present invention allows for dynamic switching between different functions in the functional block unit. This improves the efficiency of reconfigurable computing system. Additional configurations need not be loaded from off-chip to switch the function of a functional unit.

In a preferred embodiment, the functional block units have reconfigurable elements within them which are reconfigured by the configuration lines coming from the configuration state memory. The functional block units can implement a variety of functions such as add, shift, subtract, etc.

In one embodiment, the configuration state memory has a relatively few address bits and a greater number of output configuration lines. In one preferred embodiment, the configuration state memory has a three-bit address and a forty-plus bit configuration output. The number of output bits can be varied depending on the complexity of the data path unit. A three-bit address allows for eight different configurations to be stored locally near the functional block units. In one embodiment of the present invention, the memory in the configuration state memory is arranged into a background plane and a foreground plane. The arrangement into the background plane and the foreground plane allows a background plane to be loaded onto the chip without affecting the operation of the configuration state memory.

The configuration state memory may be a part of a control fabric unit. The configuration state memory is addressed by a state machine that allows the addresses for the configuration state memory to be produced locally on the reconfigurable chip. In this way, a configuration of the state machine can address multiple stored data path unit configurations in the configuration state memory. The configuration state memory preferably stores enough configurations for the data path unit that the data in the configuration state memory need not be changed every time the state machine configuration is changed. The state machine can receive inputs from functional block and the CPU on the reconfigurable chip as well as being configured from off-chip. The state machine can be implemented using a reconfigurable programmable sum of products (PSOP) generator.

BRIEF DESCRIPTION OF THE DRAWINGS

FIG. 3 is a diagram of a bus data for use in loading a configuration into the configuration state memory.

FIG. 4 is a diagram that illustrates a circuit to load a configuration into the configuration state memory for the present invention.

FIG. 5 is a diagram of a memory element that can be used in the configuration state memory of the present invention.

DETAILED DESCRIPTION OF THE PREFERRED EMBODIMENT

Figure 1:
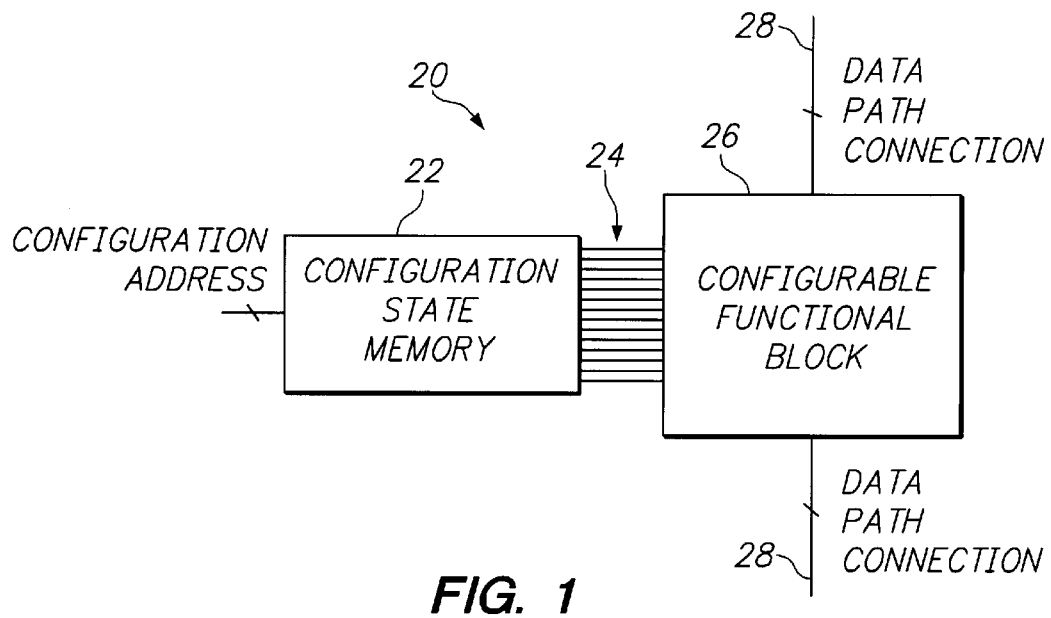
FIG. 1 is a diagram that illustrates the arrangement of a configuration state memory and a configurable functional block used in the present invention.

FIG. 1 shows a system 20 using the configuration state memory 22 of the present invention. The configuration state memory 22 receives a configuration address and produces from the configuration address a relatively large number of configuration bits sent on the configuration lines 24 to the configurable functional block 26. The configuration state memory is preferably local to the configurable functional block.

The configuration state memory stores a number of configurations for the configurable functional block. By changing the configuration address to the configuration state memory, the functions implemented by the configurable functional block (data path unit) 26 can be modified. The configurable functional block operates on data in a data path according to the pre-loaded function. The data is then sent to additional data path functional blocks using the output data path connections 28.

The advantage of the apparatus of system 20 is that the configuration of functional block 26 need not be loaded from off the reconfigurable chip. Configurations are stored in the configuration state memory 22. Since off-chip data access is an execution speed limiting factor of most computing systems, the use of configuration state memory local to the configurable functional blocks can significantly quicken the operation of a reconfigurable computing system.

The configuration state memory (CSM) 22 preferably has a relatively small number of bits used for the configuration address and much greater number of configuration bits sent to the configurable functional block. The number of configuration address bits sent to the control state memory 22 is dependent on how many dynamic configuration planes need to be stored on the chip. In one embodiment, the number of configuration address bits sent to the CSM 22 is ten or less and the number of configuration bits sent to the configurable functional block 24 is twenty or greater. In a preferred embodiment, the number of configuration address bits is three and the number of output configuration bits is forty-plus. Keeping the number of configuration address bits relatively low allows for a relatively small configuration memory and allows a relatively small state machine produce the configuration address.

In one embodiment, the configuration state memory contains four or greater configurations. In a preferred embodiment, eight configurations are addressed by a three-bit configuration address.

Figure 2A:
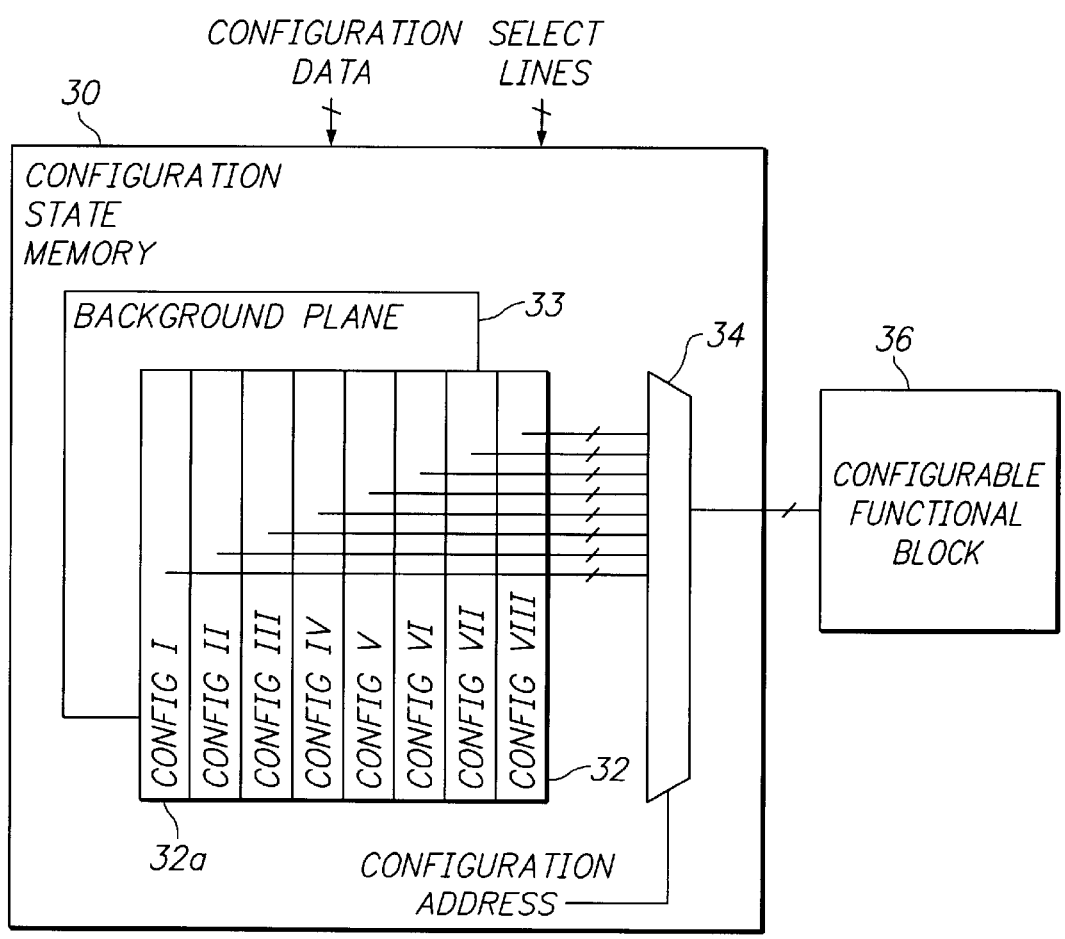
FIG. 2 is a diagram that illustrates one arrangement of the configuration state memory used in the present invention.

FIG. 2 shows one implementation of the configuration state memory 30. The configuration state memory 30 includes a number of configurations 32a in a foreground plane 32. Multiplexer 34 selects the configuration to be sent to the configurable functional block 36. In a preferred embodiment, the system additionally has a background plane 33 which stores a backup configuration to switch into the foreground plane. Both the background plane and the foreground plane data is loaded into the configuration state memory using configuration data and select lines, respectively.

FIGS. 3–5 illustrate one embodiment of a system for loading configuration data into the configuration state memory. FIG. 3 shows a bus data for the main system bus of a reconfigurable chip. The data can include x address bits and y memory element configuration bits, where x+y=n, and n is the bus size. In one embodiment, the bus size is one hundred and twenty-eight (128) bits wide, sixteen (16) address bits and one hundred and twelve (112) configuration bits are used.

FIG. 4 shows an address decoder 41 that decodes the address to produce the select lines. Memory elements (not shown) are located at the intersection of the select lines and the configuration bits. These memory elements can include the memory elements for the foreground and background plane of the configuration state memory. FIG. 5 illustrates the memory element 40 which can be located at the intersection of the select lines and configuration bits lines shown in FIG. 4. The memory element produces an output 42 and receives the write select line 44 and configuration data bits line 46. In one embodiment, one plane of the configuration state memory has eight configurations, each configuration using 45 bits.

Figure 6:
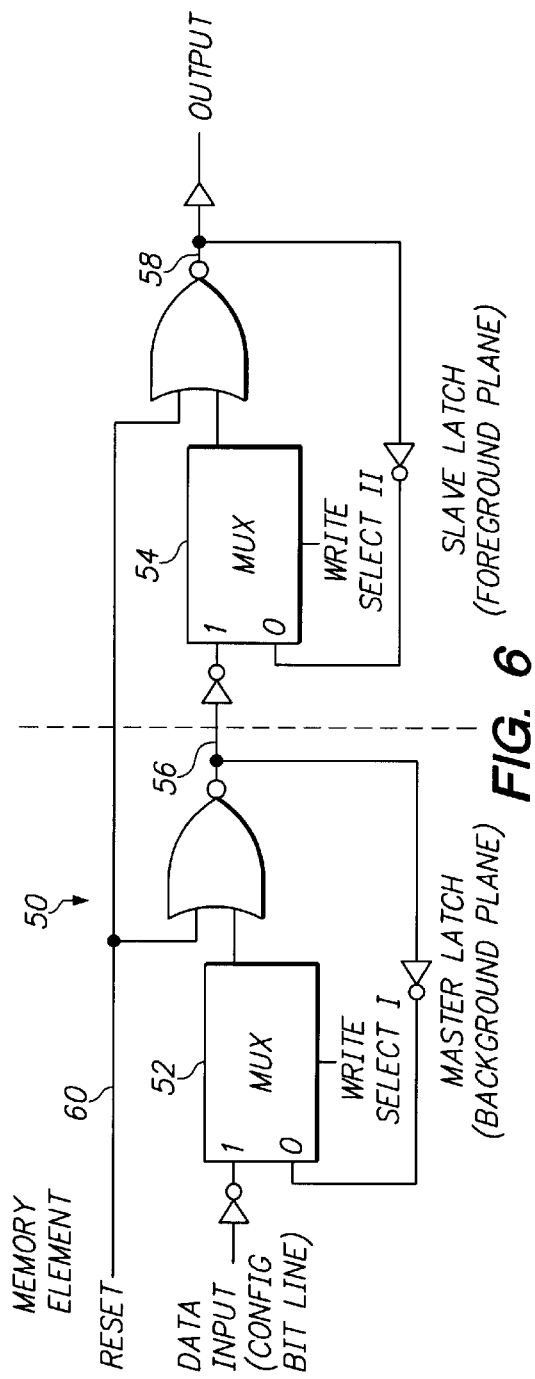
FIG. 6 is a diagram of a master/slave latch which can be used to implement one of the memory elements of a configuration state memory to allow for the foreground and background planes.

FIG. 6 illustrates one embodiment of a memory element 50 which can implement a foreground plane bit and a background plane bit. During the normal operation of the memory element, the write select I and the write select II sent to the multiplexers 52 and 54 respectively are both low. This causes the values at nodes 56 and 58 to be maintained. Node 58 stores the output value of the memory element. When configuration data is to be written into the memory element, the write select line I goes high. This causes the data on the data input line to be written into node 56, changing the value of the background plane bit. The value in the background bit at node 56 can be written into the foreground plane bit node 58 by selecting the write select line II. The write select I corresponds to one of the write select lines produced by the address decoder. Write select line II can be a signal sent to a whole block of memory elements causing the background plane to be loaded into the foreground plane.

Reset line 60 allows the nodes 56 and 58 to be zeroed. The reset line 60 is preferably connected to a memory element throughout the chip. This allows for asynchrons operation in which storage values are zeroed without requiring values be loaded through the configuration bit lines shown in FIG. 4.

Figure 7:
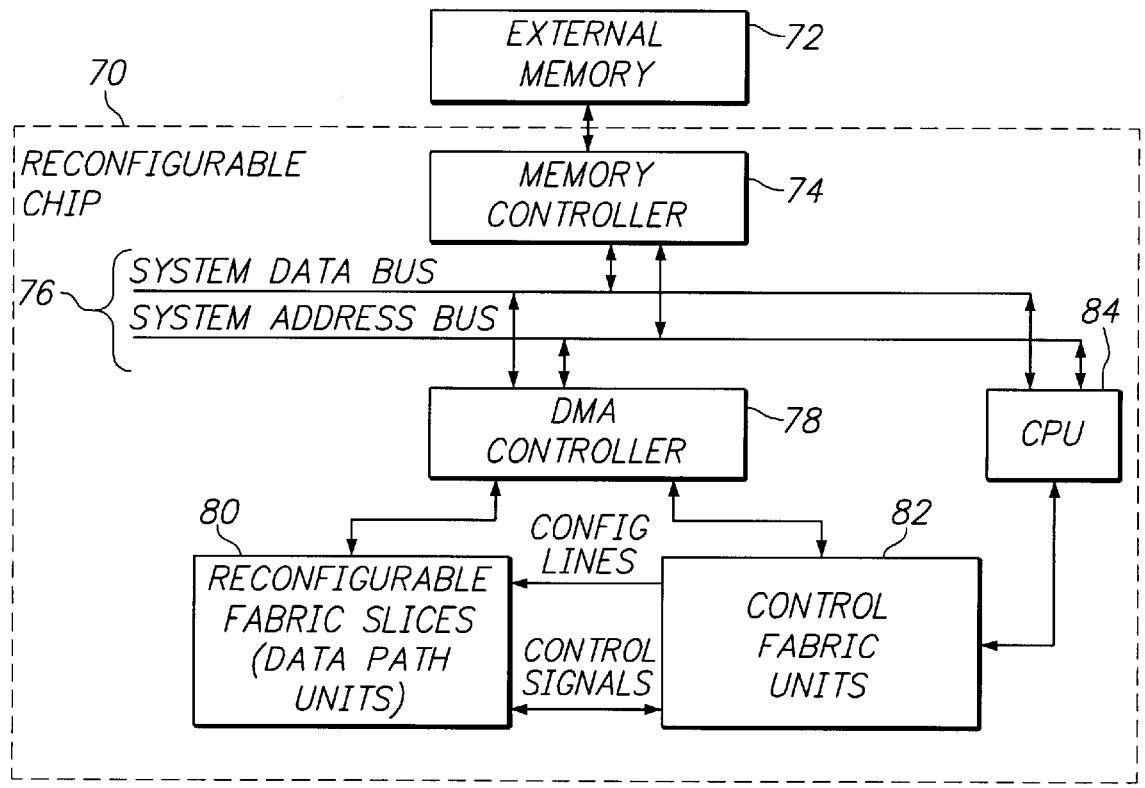
FIG. 7 is a diagram of a reconfigurable chip that can use the configuration state memory of the present invention.

FIG. 7 illustrates a reconfigurable chip 70 which can use the configuration state memory of the present invention. The reconfigurable chip 70 is connected to an external memory 72. The memory controller 74 allows data from the external memory 72 to be loaded onto bus 76. The DMA controller 78 loads data into the reconfigurable fabric slices 80 as well as the control fabric units 82. The control fabric units 82 contain the configuration state memory units (not shown) of the present invention. The reconfigurable chip 70 also includes a central processing unit (CPU) 84.

One embodiment of a reconfigurable chip for use with the present invention is disclosed in the patent application, "An Integrated Processor And Programmable Data Path Chip For Reconfigurable Computing", Ser. No. 08/884,380, filed Jun. 27, 1998, incorporated herein by reference.

Figure 8B:
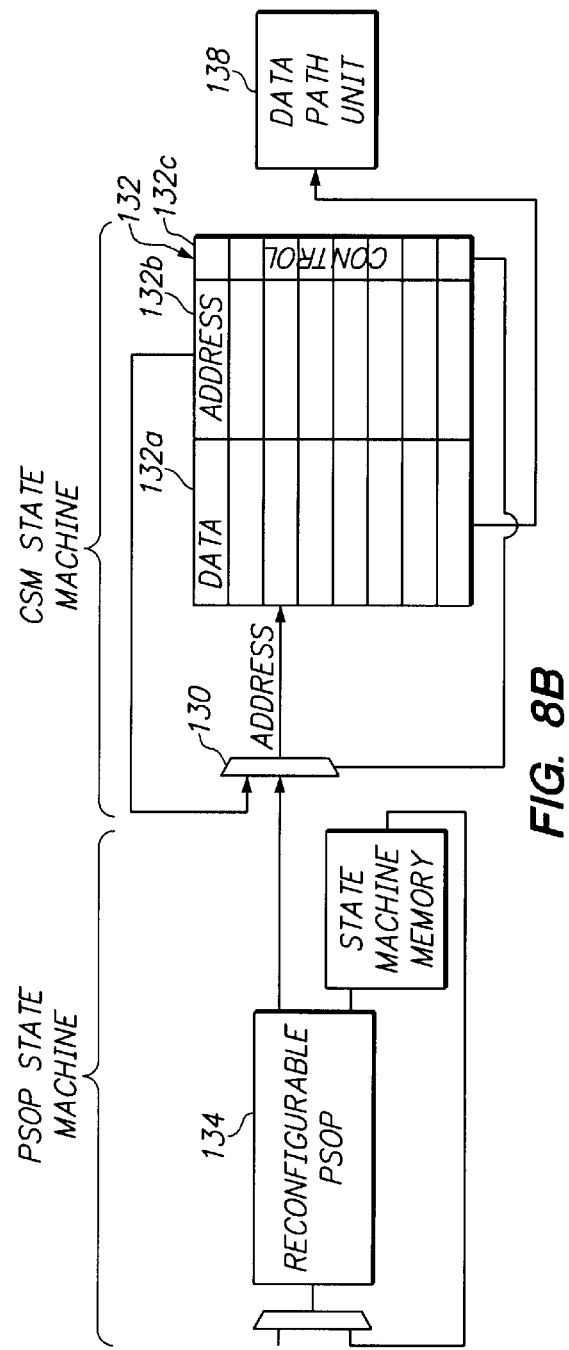
FIG. 8B is a diagram of an embodiment where the configuration state memory is part of a second state machine.
Figure 8A:
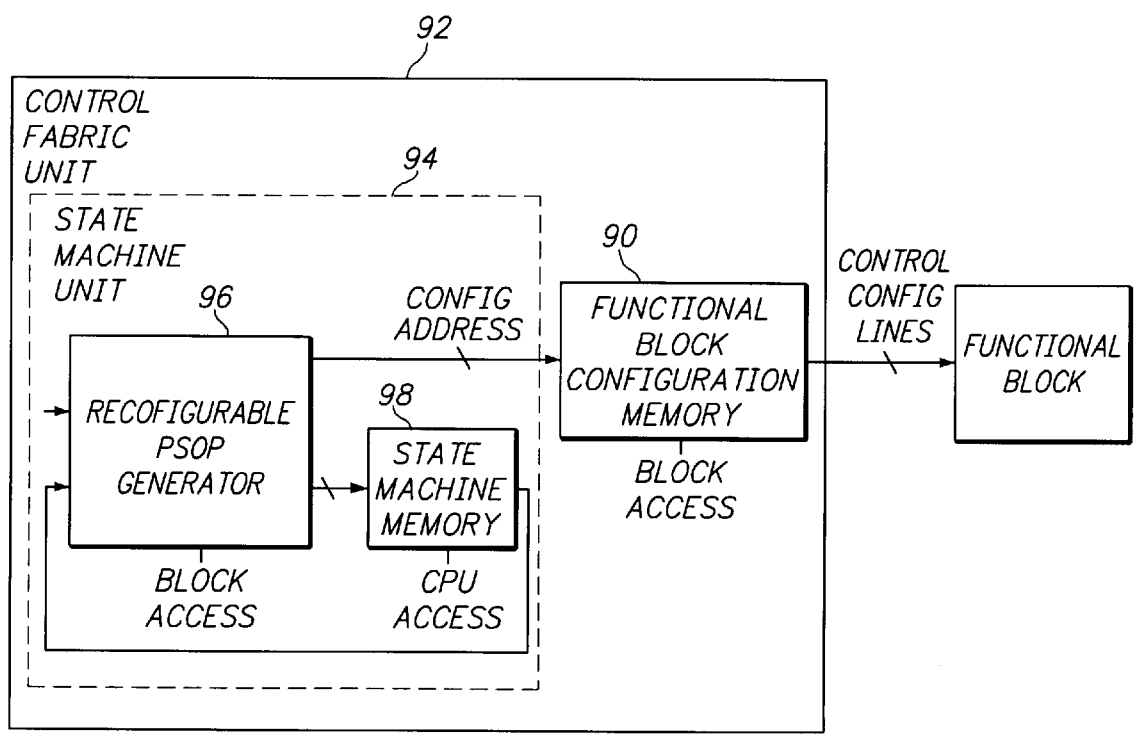
FIG. 8A is a diagram illustrating a control fabric unit using the configuration state memory of the present invention.

FIG. 8A shows the configuration state memory 90 of the present invention used within a controlled fabric unit 92. The control fabric 92 includes a state machine 94 which is adapted to produce the configuration addresses for the configuration state memory 90. In one embodiment, the state machine comprises a reconfigurable programmable sum of products generator 96 and state machine memory 98.

FIG. 8B shows multiplexer 130 that has inputs from the output of configuration state memory 132 and from the reconfigurable PSOP 134. Each line of the configuration state memory 132 has a configuration data field 132a, a next address field 132b and a control bit field 132c. The control bit field determines what input is selected by multiplexer 130. When the PSOP state machine input is selected the address from the PSOP state machine is used to select the data to go to the data path unit 138. When the CSM state machine is selected the address in address field 1326 is used as the next address to the control state memory 202. The system of FIG. 8B thus provides two compatible state machines which can allow a relatively complicated combined state machine to be stored on the reconfigurable chip.

Figure 9:
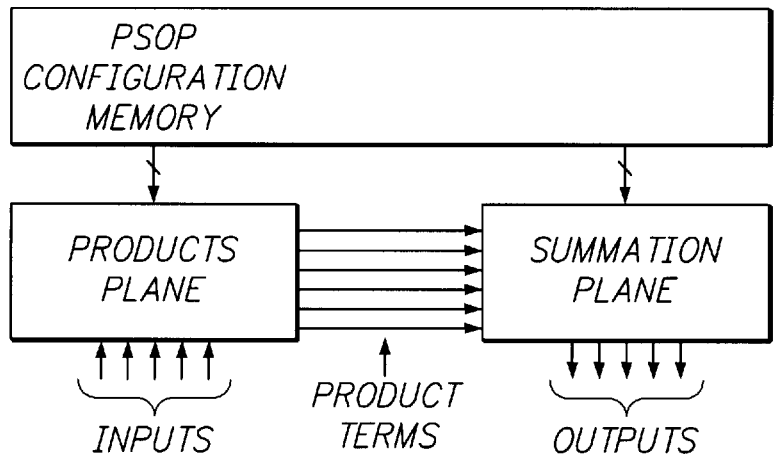
FIG. 9 is a diagram illustrating a reconfigurable programmable sum of products generator for use in a state machine in a control fabric shown in FIG. 8.

FIG. 9 illustrates a reconfigurable programmable sum of products generator. Details of one embodiment of a reconfigurable programmable sum of products generator is given in the patent application, "Reconfigurable Programmable Sum of Products Generator" Ser. No. 09/401,312, filed Sep. 23, 1999 which is incorporated herein by reference. The control path unit 92 used for one embodiment of the present invention is described in the patent application, "Control Fabric For Enabling Data Path Flow", Ser. No. 09/401,194, filed Sep. 23, 1999, which is incorporated herein by reference.

Figure 10:
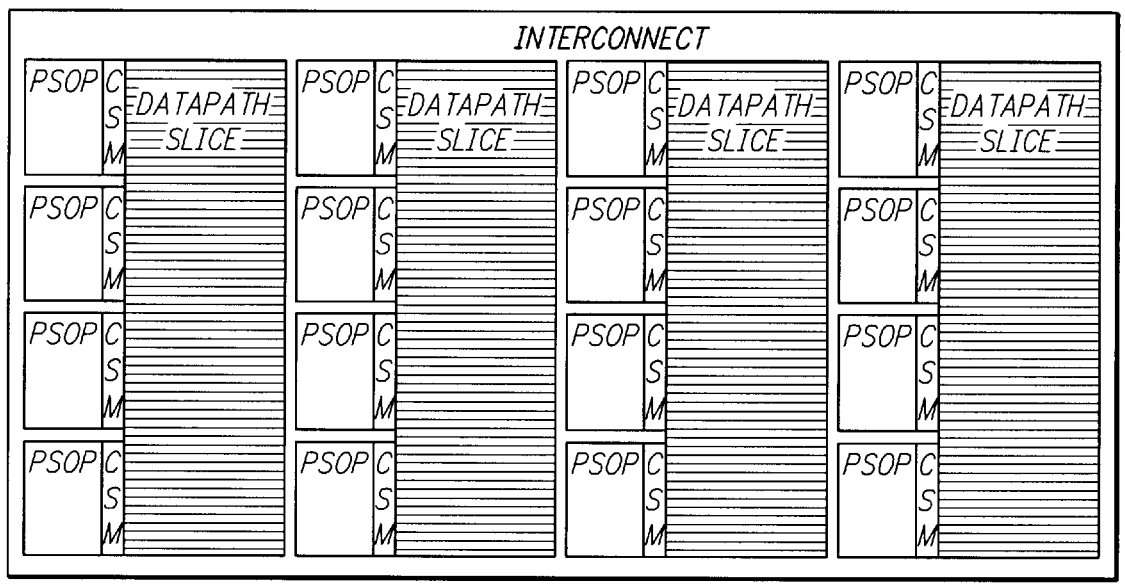
FIG. 10 is a diagram that illustrates the inner leaving of the programmable sum of products generator and configuration state memory with the data path units.

FIG. 10 illustrates the interspersing of the reconfigurable programmable sum of products generators used for the state machine units, the control state memories (CSM), and the data path slices. The data path slices include data path units which implement functional blocks in a preferred embodiment of the present invention.

The data path units are interconnected to produce the data path flow for the reconfigurable chip.

Figure 11:
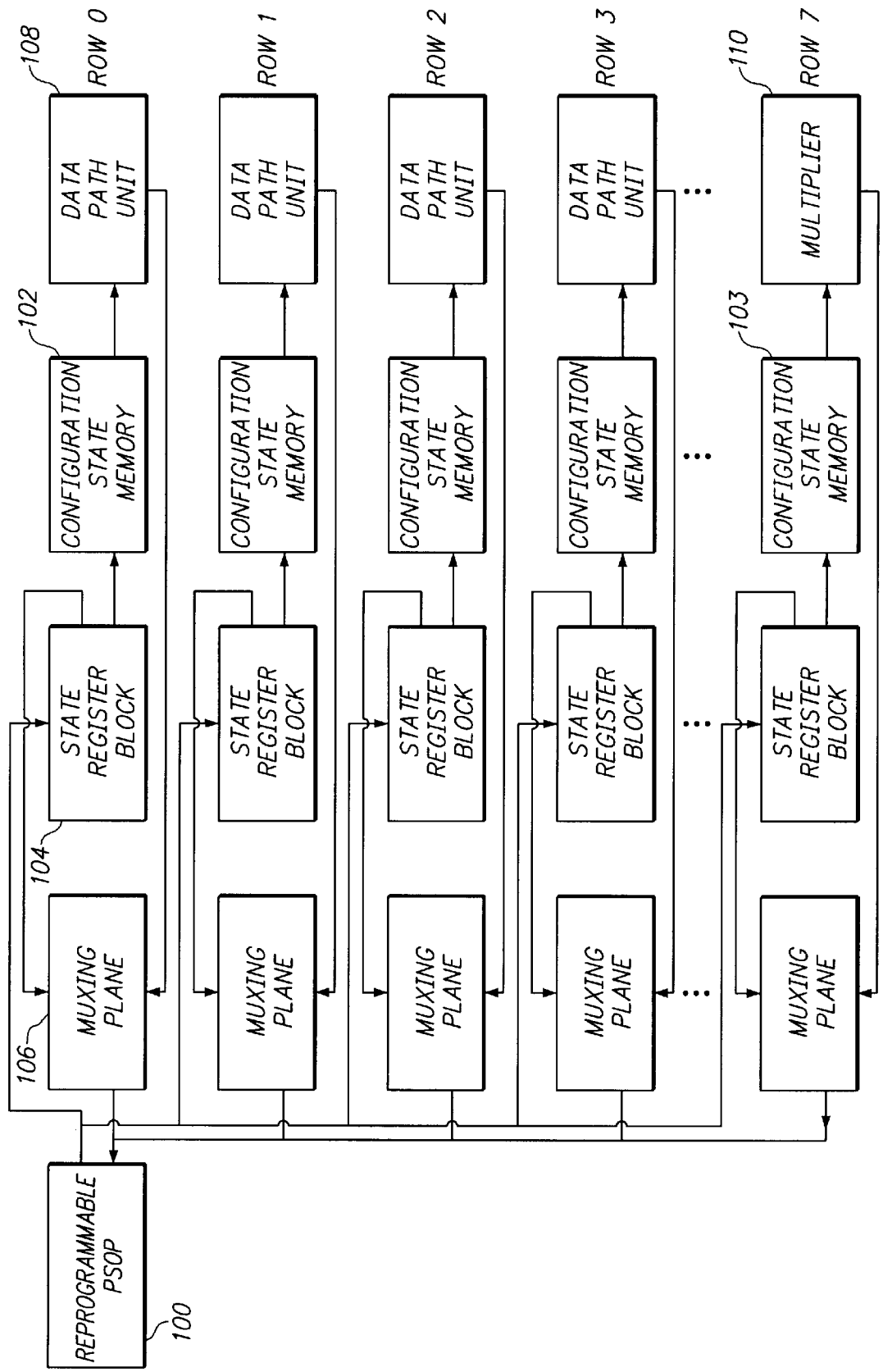
FIG. 11 is a diagram that illustrates a programmable sum of products generator which is used to address multiple configuration state memory.

FIG. 11 is a diagram of an embodiment in which a reconfigurable programmable sum of products generator 100 is connected to provide the configuration address for multiple configuration state memories 102. The state machines include the reconfigurable programmable sum of products generator 100, the state register block 104, and a multiplexer plane 106 which provide the inputs to the reconfigurable programmable sum of products generator. In this embodiment, three address bits are provided to the control state memory 102 where and forty-five configuration line bits are sent to the data path unit 108. Configuration state memory 103 provides fifty-four configuration bits to send to the multiplier 110.

It will be appreciated by those of ordinary skill in the art that the invention can be implemented in other specific forms without departing from the spirit or central character thereof. The presently disclosed embodiments are therefore considered in all respects to be illustrative and not restrictive. The scope of the invention is illustrated by the appended claims rather than the foregoing description, and all changes which come within the meaning and range for equivalence thereof are intended to be embraced herein.

We claim:

1. A reconfigurable logic chip including:
   a reconfigurable functional block adapted to be configured into a number of different functions;
   a configuration state memory adapted to store multiple configurations for the reconfigurable functional block, the configuration state memory being local to the reconfigurable functional block; and
   a programmable state machine unit adapted to produce the addresses for the configuration state memory.

2. The reconfigurable logic chip of claim 1, wherein the configuration state memory is a part of a control fabric unit for the reconfigurable logic chip.

3. The reconfigurable chip of claim 1, wherein the state machine unit includes a reconfigurable programmable sum of products generator.

4. The reconfigurable logic chip of claim 1, wherein the reconfigurable functional block comprises a data path unit.

5. The reconfigurable logic chip of claim 4, wherein a number of configurable state memories and data path units are arranged in a tile structure.

6. The reconfigurable logic chip of claim 5, wherein the data path units in adjacent tiles are interconnected.

7. The reconfigurable logic chip of claim 1, wherein the address to the configuration state memory has a fewer number of bits than the configuration output of the configuration state memory.

8. The reconfigurable logic chip of claim 7, wherein the memory addresses are less than ten bits.

9. The reconfigurable logic chip of claim 8, wherein the memory addresses comprise three-bits.

10. The reconfigurable logic chip of claim 7, wherein the output configuration is greater than twenty-bits.

11. The reconfigurable logic chip of claim 10, wherein the output configuration is greater than forty-bits.

12. The reconfigurable logic chip of claim 1, wherein the configuration state memory stores more than four configurations.

13. The reconfigurable logic chip of claim 12, wherein the configuration state memory stores eight configurations.

14. The reconfigurable logic chip of claim 1, wherein the programmable state machine unit produces addresses for multiple configuration state memories.

15. The reconfigurable logic chip of claim 1, wherein the configuration state memory includes a foreground plane and a background plane, the background plane being loadable while a configuration from the foreground plane configures the reconfigurable functional block, wherein both the foreground plane and the background plane are adapted to store multiple configurations for the reconfigurable functional block, the foreground plane being addressable to select the configuration provided to the reconfigurable functional block.

16. A reconfigurable logic chip comprising:
   a configurable functional unit adapted to operate on input data, the configurable functional unit including reconfigurable elements; and
   a control fabric unit adapted to set reconfigurable elements in the configurable functional unit, the control fabric unit including a configuration memory adapted to store multiple configurations for the configurable functional unit, the configuration state memory being local to the configurable functional unit, wherein the fabric includes a programmable state machine unit adapted to produce the addresses for the configuration state memory.

17. The reconfigurable logic chip of claim 16, wherein the state machine unit includes a reconfigurable programmable sum of products generator.

18. The reconfigurable logic chip of claim 17, wherein the state machine unit further includes a muxing plane connected to the programmable sum of products generator.

19. The reconfigurable logic chip of claim 17, wherein a state register block is operatively connected to the programmable sum of products generator and to the configuration memory.

20. The reconfigurable logic chip of claim 16, wherein the configurable functional unit comprises a data path unit.

21. The reconfigurable logic chip of claim 16, wherein the programmable state machine unit produces addresses for multiple configuration memories.

22. A reconfigurable logic chip including:
   a control fabric unit adapted to set reconfigurable elements in at least one configurable functional unit, the control fabric including a programmable state machine unit and at least one configuration memory operably connected to the state machine unit, the configuration memory storing a number of configurations for the configurable functional unit, wherein the configurable functional unit is adapted to operate on data and wherein the programmable state machine unit is adapted to produce the addresses for the configuration state memory.

23. A reconfigurable logic chip including:
   a reconfigurable functional block adapted to be configured into a number of different functions; and
   a configuration state memory being local to the reconfigurable functional block, the configuration state memory including a foreground plane and a background plane, the background plane being loadable while a configuration from the foreground plane configures the reconfigurable functional block, wherein both the foreground plane and the background plane are adapted to store multiple configurations for the reconfigurable functional block, the foreground plane being addressable to select the configuration provided to the reconfigurable functional block.

24. The reconfigurable logic chip of claim 23, wherein the configuration state memory is a part of a control fabric unit for the reconfigurable logic chip.

25. The reconfigurable logic chip of claim 24, wherein the control fabric unit further comprises a programmable state machine unit used to produce the addresses for the configuration state memory.

26. The reconfigurable chip of claim 25, wherein the state machine unit includes a reconfigurable programmable sum of products generator.

27. The reconfigurable logic chip of claim 23, wherein the reconfigurable functional block comprises a data path unit.

28. The reconfigurable logic chip of claim 27, wherein a number of configurable state memories and data path units are arranged in a tile structure.

29. The reconfigurable logic chip of claim 28, wherein the data path units in adjacent tiles are interconnected.

30. The reconfigurable logic chip of claim 23, wherein the address to the configuration state memory has a fewer number of bits than the configuration output of the configuration state memory.

31. The reconfigurable logic chip of claim 30, wherein the memory addresses are less than ten bits.

32. The reconfigurable logic chip of claim 31, wherein the memory addresses comprise three-bits.

33. The reconfigurable logic chip of claim 30, wherein the output configuration is greater than twenty-bits.

34. The reconfigurable logic chip of claim 33, wherein the output configuration is greater than forty-bits.

35. The reconfigurable logic chip of claim 33, wherein the foreground plane stores more than four configurations.

36. The reconfigurable logic chip of claim 35, wherein the foreground plane stores eight configurations.

37. The reconfigurable logic chip of claim 23, wherein a programmable state machine unit produces addresses for multiple configuration state memories.

* * * * *